United States Patent [19]

Brogden et al.

[11] Patent Number: 5,227,041
[45] Date of Patent: Jul. 13, 1993

[54] DRY CONTACT ELECTROPLATING APPARATUS

[75] Inventors: Bruce N. Brogden, San Jose; Leon P. Brown, Newark; Syed A. Husain, Milpitas, all of Calif.

[73] Assignee: Digital Equipment Corporation, Maynard, Mass.

[21] Appl. No.: 898,038

[22] Filed: Jun. 12, 1992

[51] Int. Cl.⁵ .............................................. C25D 17/06
[52] U.S. Cl. ............................ 204/297 R; 204/297 W
[58] Field of Search ........................ 204/297 R, 297 W

[56] References Cited

U.S. PATENT DOCUMENTS

| | | | |
|---|---|---|---|
| 2,751,345 | 6/1956 | Osman | 204/297 W |
| 3,509,036 | 4/1970 | Igras et al. | 204/297 R X |
| 3,824,176 | 7/1974 | Crowe | 204/297 R |
| 4,971,676 | 11/1990 | Doue et al. | 204/297 R X |
| 5,078,852 | 1/1992 | Yee et al. | 204/297 R |

*Primary Examiner*—Donald R. Valentine
*Attorney, Agent, or Firm*—Flehr, Hohbach, Test, Albritton & Herbert

[57] ABSTRACT

A dry contact electroplating structure is disclosed. The structure includes a base member for immersion within an electroplating solution. The base member has a central aperture defined by an aperture perimeter formed within the base member. A sealing ring is positioned adjacent to the aperture perimeter. The sealing ring forms a sealing connection with an object to be electroplated. A number of electrical contacts are positioned adjacent to the sealing ring. The electrical contacts form an electrical connection with one side of the object to be electroplated. A lid is positioned on the base member over one side of the central aperture. Thus, the lid protects the electrical contacts and one side of the object to be electroplated, while the other side of the object is exposed to the electroplating solution.

9 Claims, 4 Drawing Sheets

DRY CONTACT ELECTROPLATING APPARATUS

BRIEF DESCRIPTION OF THE INVENTION

The present invention generally relates to the electroplating of an object. More particularly, this invention relates to a dry contact electroplating apparatus that is particularly useful for electroplating a high component density electrical device fabricated on a wafer.

BACKGROUND OF THE INVENTION

Processes for electroplating metallic coatings onto objects are known in the art. Electroplating is typically employed to alter the existing surface properties of an object. For instance, electroplated coatings are commonly applied to improve resistance to corrosion or abrasion, or to impart desirable electrical or magnetic properties to an object.

An electroplating process involves the following steps. The object to be electroplated is attached to a plating apparatus which serves as a cathode terminal. The plating apparatus is then immersed into an electrolytic solution. An electrode is immersed into the same solution and is electrically connected as an anode. A direct current is then applied to the electrolytic solution, thereby dissociating positively charged metal ions at the anode. The ions then migrate to the cathode, where they plate the object attached to the cathode.

Electroplating processes are commonly employed to deposit metals during the fabrication of high component density electrical devices. For example, electroplating processes are used while fabricating semiconductor dies and thin-film interconnections.

By way of example, FIG. 1 depicts a wet contact electroplating apparatus 20 which is used during thin-film interconnection fabrication. The wet contact electroplating apparatus 20 includes a number of arms 22A, 22B, 22C, and 22D for holding a wafer 24. The wafer 24 may include an aluminum base upon which conducting patterns are formed between insulating layers. For example, a layer of metal may be deposited on the base. The metal may then be etched into a predetermined conducting pattern. Then, a layer of polyimide may be formed over the conducting pattern. Thereafter, a chromium/copper layer may be sputtered onto the polyimide to prepare the surface for the electrodeposition of another layer of metal. After the electrodeposition of the metal and its etching into another conducting pattern, the process is repeated.

Regardless of the type of object which is subject to electrodeposition, a number of shortcomings are associated with a wet contact apparatus of the type disclosed in FIG. 1. A number of steps are required to prepare the apparatus 20 for electrodeposition. First, the metallic apparatus 20 must be sheathed in a non-conducting substance, such as plastic. Afterwards, the non-conducting substance must be scrapped at its arms 22 to expose the metal for electrical connection. Subsequently, the wafer 24 is positioned within the arms 22 and the apparatus 20 is immersed into an electrolytic solution.

During the electrodeposition process the metal on the arms 22 of the apparatus 20 is exposed to the electrolytic solution. Thus, a plated mass is formed as the electroplated substance accumulates on the arms 22. This plated mass disrupts the electrical characteristics of the cathode. Consequently, the plated mass may cause a non-uniform deposit on the wafer 24.

After the plating process, the plated mass on the apparatus 20 must be removed. This typically involves using a toxic stripping solution. Subsequently, specially tailored environmental steps must then be taken to dispose of the stripping solution.

As previously mentioned, a non-uniform deposit on an electroplated object may be caused by the plated mass formed on the arms 22 of the wet apparatus 20. Non-uniform deposits may also result from the fact that a wet contact apparatus makes electrical contact at the edge of the wafer, as opposed to the surface of the wafer. Non-uniform deposits may also result from one object to the next if the objects to be electroplated are positioned at different locations in the apparatus 20. This problem is especially acute in the context of thin-film depositions, where extremely high accuracy of plated metal is required.

Another problem associated with the wet contact apparatus of the prior art is the formation of "stringers". Stringers 26 are depicted in FIG. 1. Stringers are splinter-like objects that commonly form on the edge of a wafer during thin-film fabrication. Stringers may be created in a number of ways. Stringers occasionally form because the geometry of the sputtering equipment prevents a direct application of sputtered copper to the edge of a wafer. Consequently, the adhesion of the sputtered copper on the wafer edge is poor, commonly causing the copper to peel. This problem is exacerbated as the plating step builds up any peeling segment. Stringers may also be formed when the arms 22 rub against the edge of the wafer 24.

Regardless of the cause of their formation, stringers create a number of problems. If the stringers bridge onto the face of the wafer they may create a short circuit on the device. Detached stringers may accumulate and cause equipment shorting and other processing problems which are known in the art.

SUMMARY OF THE INVENTION

A dry contact electroplating structure is disclosed. The structure includes a base member for immersion within an electroplating solution. The base member has a central aperture defined by an aperture perimeter formed within the base member. A sealing ring is positioned adjacent to the aperture perimeter. The sealing ring forms a sealing connection with an object to be electroplated. A number of electrical contacts are positioned adjacent to the sealing ring. The electrical contacts form an electrical connection with one side of the object to be electroplated. A lid is positioned on the base member over one side of the central aperture. Thus, the lid protects the electrical contacts and one side of the object to be electroplated, while the other side of the object is exposed to the electroplating solution.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
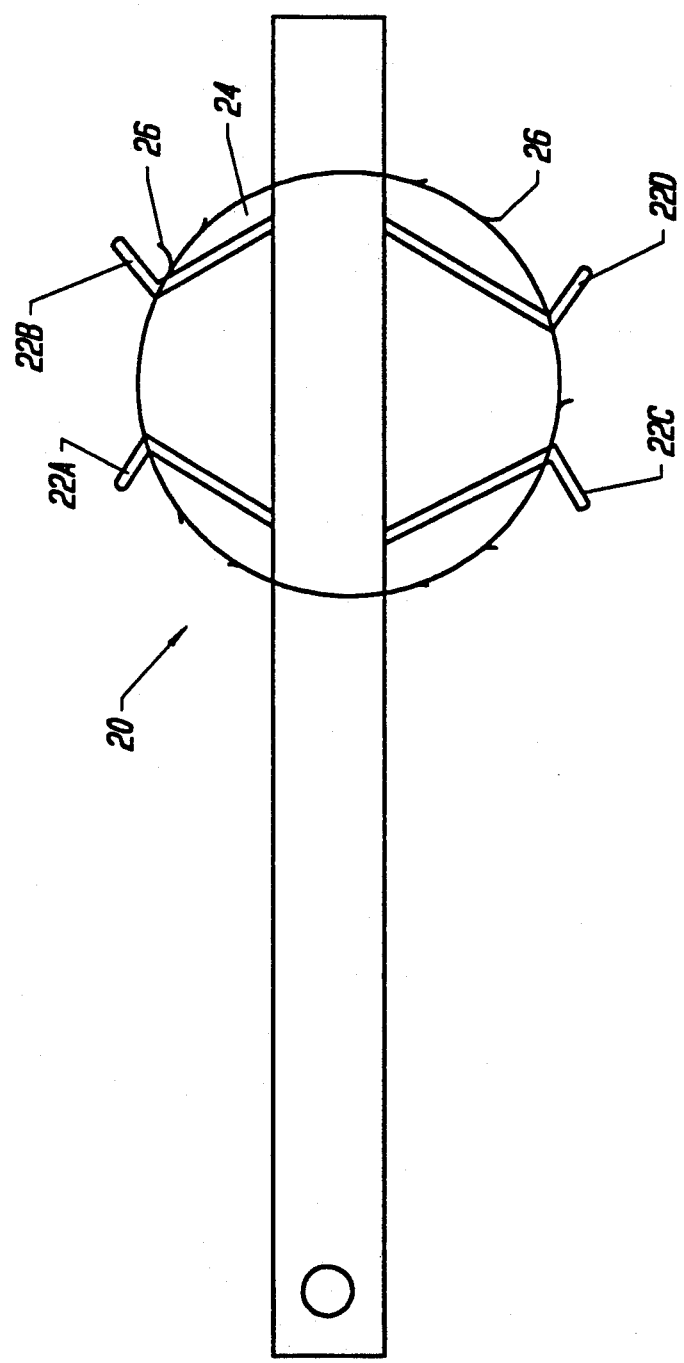
FIG. 1 is a plan view of a wet contact electroplating structure in accordance with the prior art.
Figure 2:
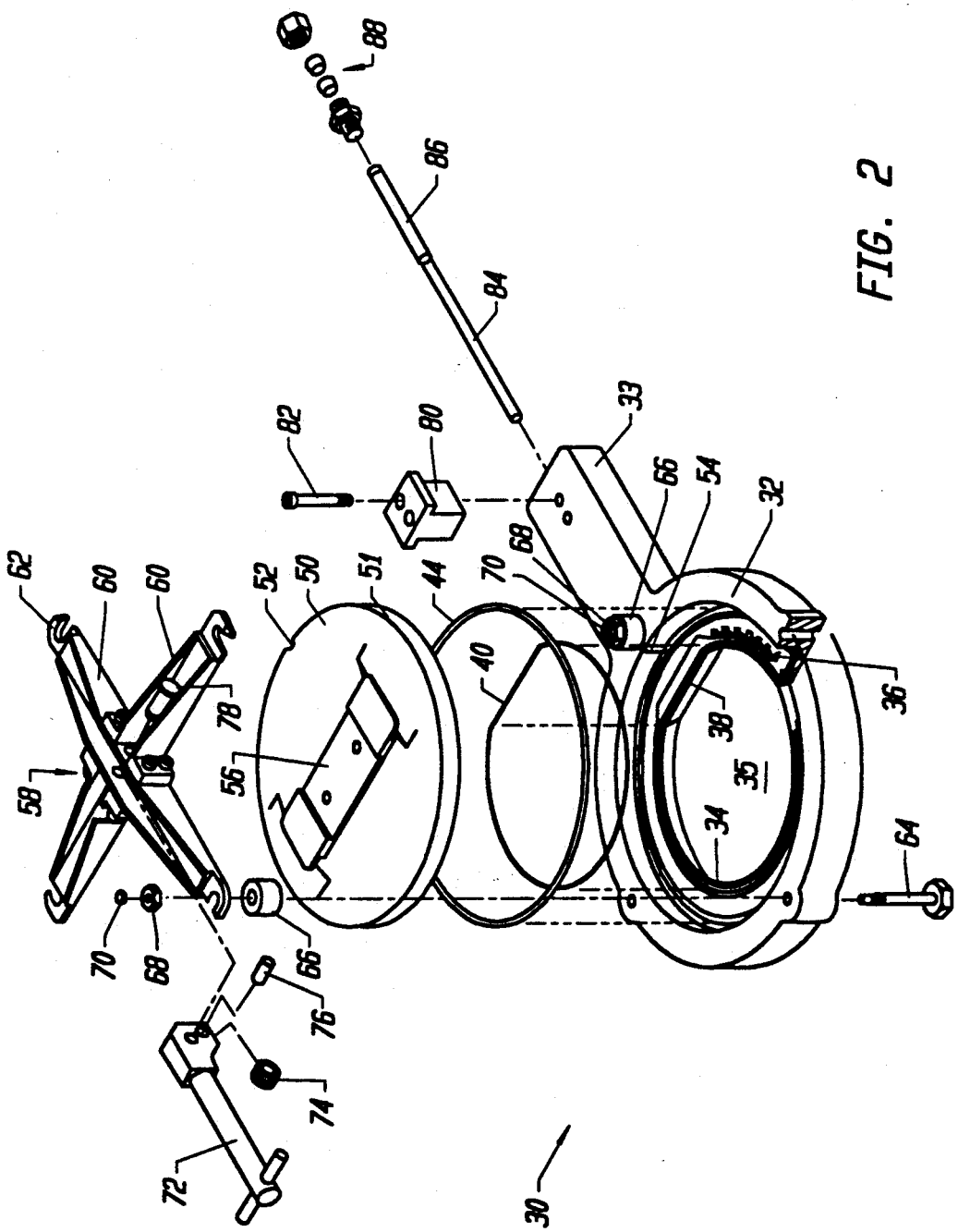
FIG. 2 is an exploded view of the dry contact electroplating structure of the present invention.

FIG. 2 provides an exploded view of a dry contact electroplating apparatus 30 in accordance with the present invention. The apparatus 30 includes a base 32 and a handle 33. An aperture perimeter 34 defines a central aperture 35 within the base 32. A number of electrical contacts, or tangs, 36 are provided adjacent to the central aperture 35. Preferably, the contacts are pliantly mounted by positioning them on some type cushioning member which will accommodate variations in the planarity of the object to be electroplated.

Figure 3:
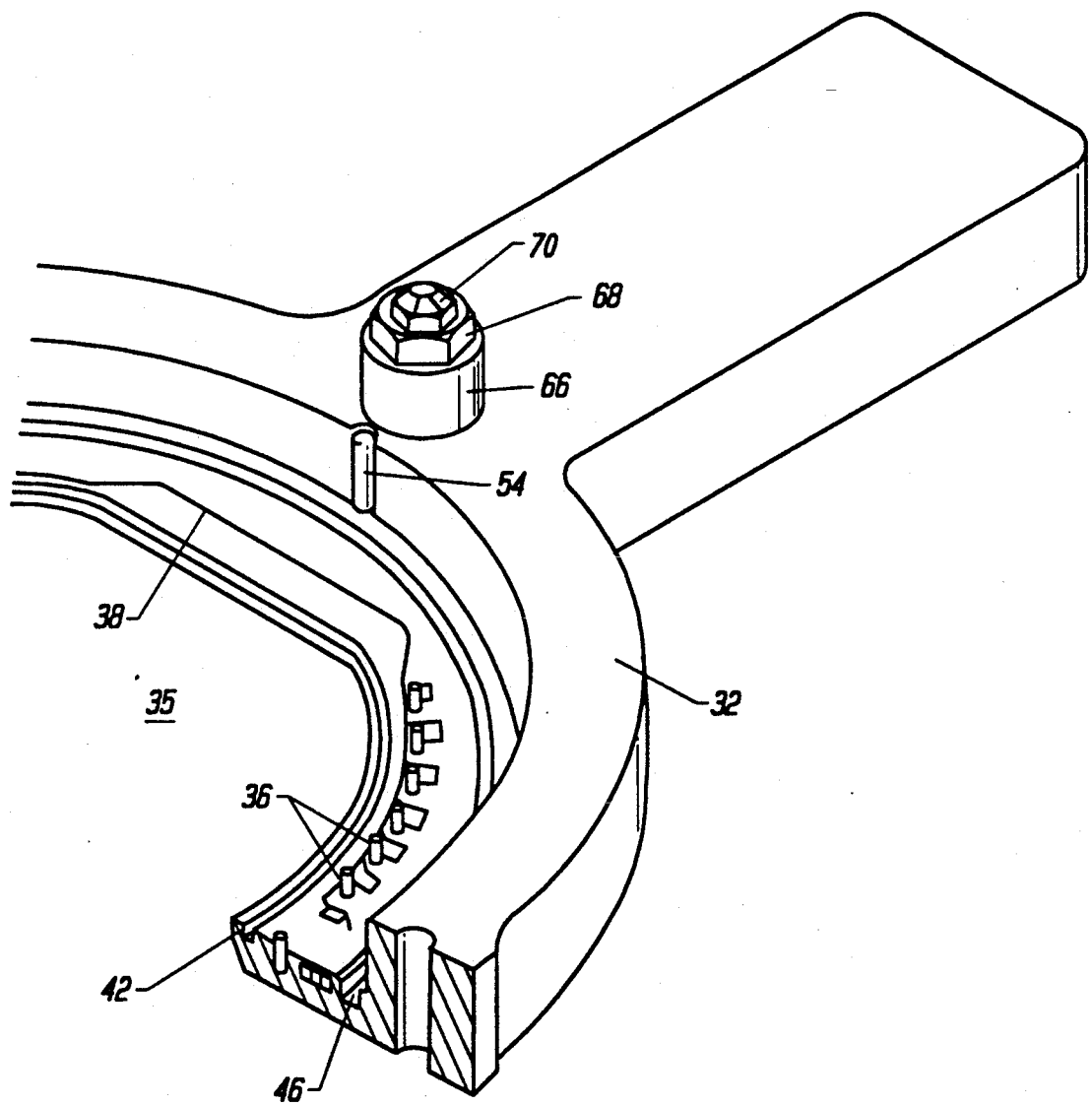
FIG. 3 is an enlarged perspective view of one portion of the electroplating structure of the present invention.

FIG. 3 is an enlarged perspective view of a portion of the apparatus 30. In particular, the figure depicts a cushioning member 37, such as rubber, beneath the electrical contacts 36. The electrical contacts 36 preferably include relatively sharp tips for piercing any insulating substance which might be present on the wafer 24.

Figure 4:
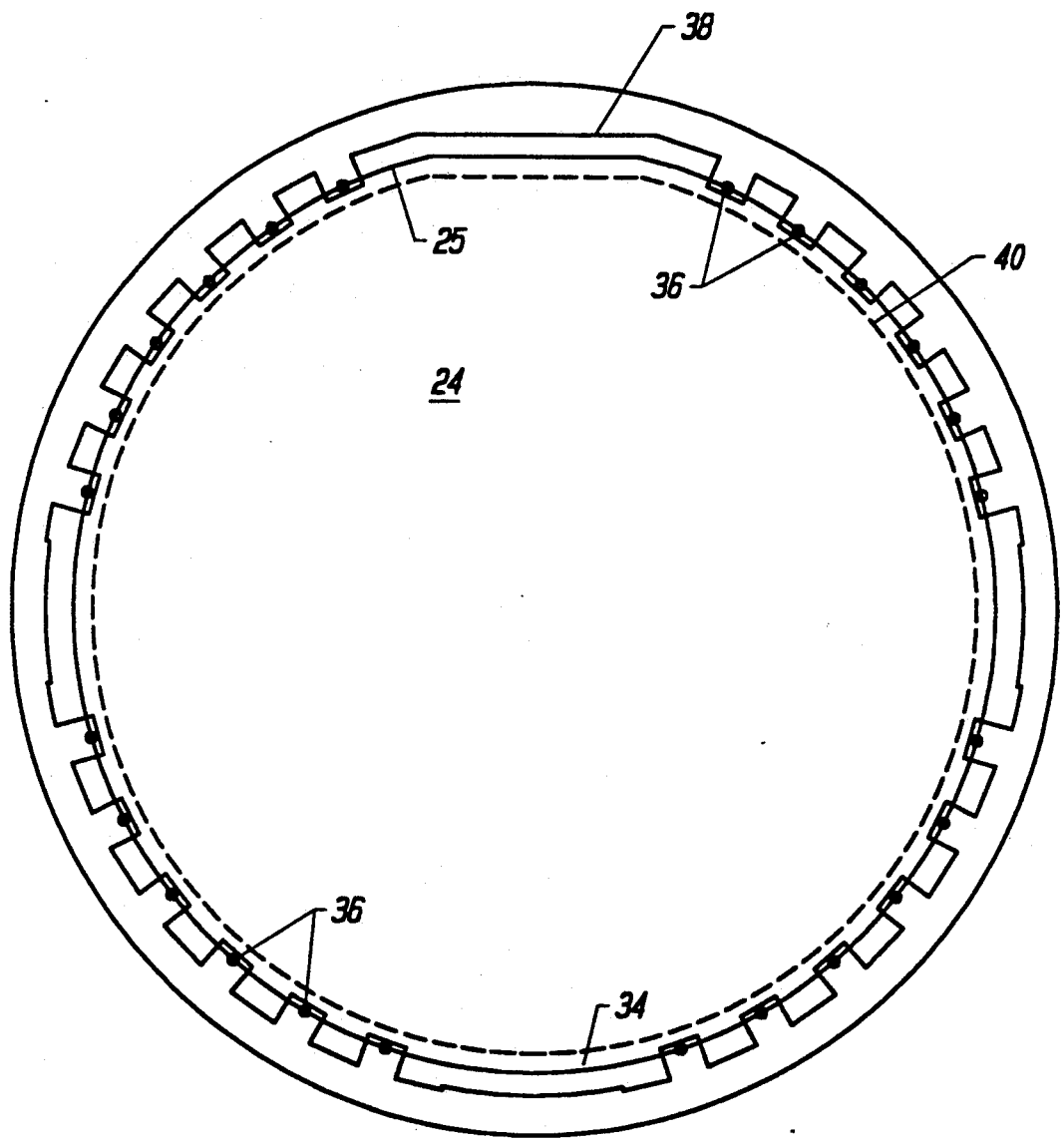
FIG. 4 is a plan view of dry electrical contacts coupled to the outer perimeter of a wafer to be electroplated.

FIG. 4 is a plan view of the central aperture perimeter 34 and electrical contacts 36. Also depicted is a wafer 24 with an outer perimeter which is in physical contact with the electrical contacts 36. FIG. 4 also depicts that the central aperture perimeter 34 includes a flat edge 38 which corresponds with the flat edge which is typically found on a wafer. The flat edge 38 allows one to load each wafer 24 into the apparatus in the same manner. This facilitates the uniform plating of wafers from one batch to the next.

Returning to FIG. 2, a sealing ring 40 is depicted in an exploded fashion. As indicated by the lines corresponding to the sealing ring 40, the sealing ring 40 is positioned inside the electrical contacts 36. As seen in FIG. 3, a sealing ring channel 42 is provided for receiving the sealing ring 40. Thus, when wafer 24 is placed inside base 32, the outer perimeter of the wafer 24 makes contact with the electrical contacts 36, and the sealing ring 40 makes contact with the wafer 24 inside the outer perimeter of the wafer. As will be more fully described below, the sealing ring 40 provides a sealing connection with the wafer 24 so that the electrical contacts 36 are never exposed to the electroplating solution.

FIG. 2 also depicts, in exploded fashion, a cushioning ring 44. As seen in FIG. 3, a cushioning ring channel 46 is preferably provided to receive the cushioning ring 44.

Returning to FIG. 2, a lid 50 is provided in accordance with the invention. The lid 50 includes lip 51 which rests upon cushioning ring 44 when the lid 50 is positioned over the central aperture 35 of the base 32. The lid 50 covers one side of the wafer 24 to be electroplated. The lid 50 also forces the wafer 24 against the sealing ring 40 to strengthen the sealing connection. Thus, a sealing connection is formed on one side of the wafer 24 to prevent exposure to the electroplating solution, while the lid 50 keeps the other side of the wafer unexposed to the electroplating solution.

The lid 50 preferably includes an alignment groove 52 which is used for positioning with alignment pin 54. A thrust plate 56 may be provided on top of the lid 50. A clamp 58 is preferably used to couple the lid 50 to the base 32. The clamp 58 may include a number of posts 60 which each include a hook 62. Each hook 62 is linked with a corresponding stud 64 through a spacer 66, nut 68, and topping nut 70.

A lever 72 is used in conjunction with the clamp 58. The lever 72 includes a roller 74 which is held by roller pin 76. A lever axle pin 78 couples the lever 72 to the clamp 58.

Other elements of the apparatus 30 include a hanger 80 which is coupled to the handle 33 by bolt 82. A conductor 84 is positioned within handle 33 through post 86. A nut set 88 holds post 86. The conductor is coupled to the electrical contacts 36.

In accordance with one embodiment of the invention, the base 32 and clamp 58 may be formed of stainless steel, while the lid 50 may be formed of plastic. The roller 74 may be formed of stainless steel and may include a plastic sleeve-bearing.

Thus, a dry contact electroplating apparatus is provided in accordance with the present invention. One skilled in the art will recognize a number of advantages associated with the invention. Since the apparatus provides dry electrical contacts, a plated mass does not accumulate at the electrical contacts. Consequently, there is no electrical disruption during the plating process. In addition, a stripping solution does not have to be used to remove the plated mass.

Electroplating is enhanced by the fact that a plated mass does not disrupt the electrical connection with the object to be electroplated. The dry contact electroplating apparatus of the invention is also an improvement over the prior art since the electrical contacts are coupled on the face of the object, as opposed to the sides of the object. This improves the consistency and quality of the electric field applied to the object to be electroplated.

The improved electrical characteristics of the dry contact electroplating apparatus of the invention facilitates the electroplating of intricate surface geometries, such as those found on high component density electrical devices. The improved electrical characteristics of the dry contact electroplating apparatus also results in greater consistency between separate electroplating processes.

Another benefit associated with the invention is that it largely eliminates the problem of stringers. With the invention, the wafer edges are not exposed to the plating solution. The invention eliminates the problem of forming stringers by rubbing against the arms of a wet contact apparatus.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An apparatus for facilitating the electroplating of an object, said apparatus comprising:
    a base member for immersion within an electroplating solution, said base member including:

a central aperture defined by an aperture perimeter formed within said base member;

a sealing ring positioned adjacent to said aperture perimeter, said sealing ring forming a sealing connection with the object to be electroplated, said object to be electroplated including a first side and a second side; and a plurality of pliantly mounted electrical contacts positioned adjacent to said sealing ring, said plurality of pliantly mounted electrical contacts forming electrical connections with said first side of said object to be electroplated; and a lid positioned on said base member over one side of said central aperture, said lid thereby protecting said plurality of electrical contacts and said second side of said object to be electroplated from said electroplating solution.

2. The apparatus of claim 1 wherein said base member is connected to a handle.

3. The apparatus of claim 1 wherein said apparatus further comprises a cushining ring for pliantly accepting said lid, said lid including a perimeter lip which is coupled to said cushioning ring.

4. The apparatus of claim 3 further comprising a clamp for coupling said lid to said base, said clamp including a plurality of posts for coupling to the outer perimeter of said base; and a lever for tightening said lid against said base.

5. An apparatus for electroplating a high component density electrical device fabricated on a wafer having an outer perimeter, said apparatus comprising:

a central member for immersion within an electroplating solution, said central member including:
a handle;
a frame connected to said handle;
a central aperture defined by an aperture perimeter formed within said frame;

a sealing ring positioned adjacent to said aperture perimeter, said sealing ring forming a sealing connection with the outer perimeter of the wafer to be electroplated, said wafer to be electroplated including a first side and a second side; and a plurality of electrical contacts pliantly mounted adjacent to said sealing ring, said plurality of electrical contacts forming electrical connections with said first side of said wafer to be electroplated; and a lid positioned on said central member over one side of said central aperture, said lid forcing said wafer against said plurality of electrical contacts and said sealing ring, said lid further protecting said second side of said wafer from said electroplating solution while said first side of said wafer is exposed to said electroplating solution.

6. The apparatus of claim 5 wherein each of said plurality of electrical contacts includes a tip for impinging upon said wafer.

7. The apparatus of claim 5 further comprising a clamp positioned over said lid for securely attaching said lid to said frame.

8. The apparatus of claim 7 further comprising a clamp for coupling said lid to said base, said clamp including a plurality of posts for coupling to the outer perimeter of said base; and a lever for tightening said lid against said base.

9. The apparatus of claim 8 further comprising a cushioning ring for pliantly accepting said lid.

* * * * *